United States Patent [19]

Fong

[11] Patent Number: 5,600,593
[45] Date of Patent: Feb. 4, 1997

[54] APPARATUS AND METHOD FOR REDUCING ERASED THRESHOLD VOLTAGE DISTRIBUTION IN FLASH MEMORY ARRAYS

[75] Inventor: Vincent L. Fong, Cuppertino, Calif.

[73] Assignee: National Semiconductor Corporation, Santa Clara, Calif.

[21] Appl. No.: 349,812

[22] Filed: Dec. 6, 1994

[51] Int. Cl.$^6$ .................................................. G11C 7/00
[52] U.S. Cl. .............................. 365/185.19; 365/185.29; 365/185.33
[58] Field of Search ........................ 365/185.19, 218, 365/201, 185.18, 185.33, 185.29, 185.03

[56] References Cited

U.S. PATENT DOCUMENTS

| | | | |
|---|---|---|---|
| 5,172,338 | 12/1992 | Mehrotra | 365/185 |
| 5,329,487 | 7/1994 | Gupta | 365/185 |
| 5,386,388 | 1/1995 | Atwood | 365/218 |
| 5,402,370 | 3/1995 | Fazio | 365/218 |
| 5,424,993 | 6/1995 | Lee | 365/218 |

OTHER PUBLICATIONS

Kuniyoshi Yoshikawa et al., "Comparison of Current Flash EEPROM Erasing Methods: Stability and How to control", 1992, pp. 595–598, IEDM Technical Digest.

K. Oyama et al., "A Novel Erasing Technology for 3.3V Flash Memory with 64Mb Capacity and Beyond", 1992, pp. 607–610, IEDM Technical Digest.

Seiji Yamada et al., "A Self-Convergence Erasing Scheme For a Simple Stacked Gate Flash EEPROM", 1991, pp. 307–310, IEDM Technical Digest.

*Primary Examiner*—Amir Zarabian
*Attorney, Agent, or Firm*—Limbach & Limbach L.L.P.

[57] ABSTRACT

A flash memory system and method for providing an array of erased flash memory cells having a reduced dispersion of erased threshold voltages. The cells of the system are erased in bulk, preferably utilizing some form of cold electron injection, and the cells are tested to determine whether the erased threshold voltage falls between a predetermined target maximum threshold voltage and a predetermined target minimum threshold voltage. In the event one or more cells has been over erased so that the measured threshold voltage is less than the target minimum values, all of the cells are lightly programmed so as to increase the actual threshold voltage. The light programming is repeated until all of the cells have an actual threshold voltage that exceeds the target minimum but is less than the target maximum.

30 Claims, 9 Drawing Sheets

APPARATUS AND METHOD FOR REDUCING ERASED THRESHOLD VOLTAGE DISTRIBUTION IN FLASH MEMORY ARRAYS

BACKGROUND OF THE INVENTION

1. Field of the Invention

The present invention relates generally to electrically programmable, electrically erasable, read only memories (EEPROM) devices and, in particular, to an array of flash memory devices having a narrow range of erased threshold voltages making such devices suitable for low voltage operation.

2. Background Art

Figure 1A:
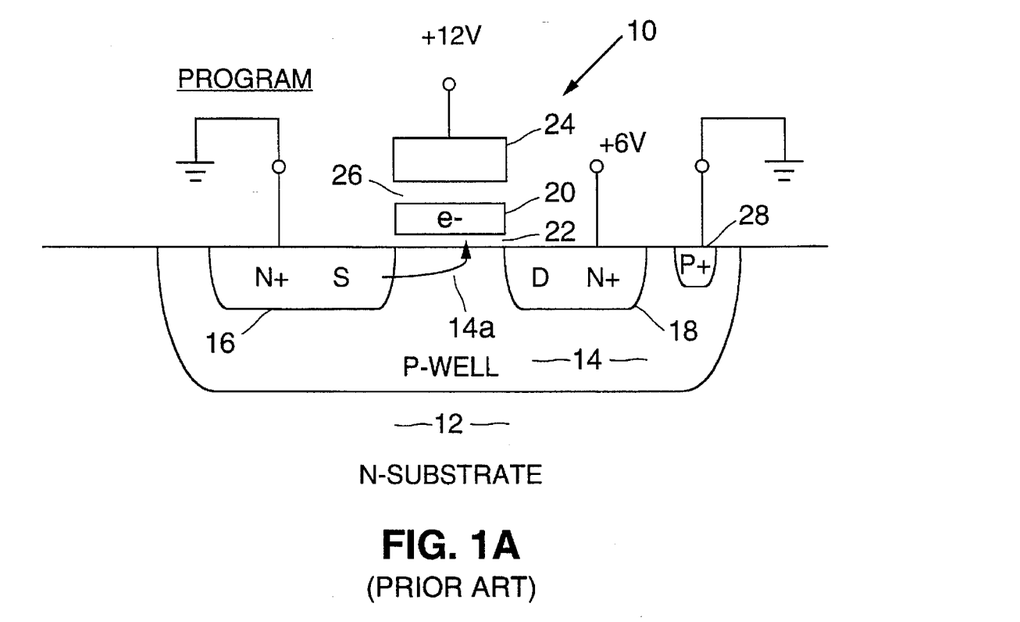
FIG. 1A depicts a conventional flash memory cell and typical voltages used for programming the cell.

FIG. 1A shows a simplified typical conventional flash memory cell, generally designated by the numeral 10. Cell 10 is formed in an N type substrate 12. A P type well 14 is formed in substrate 12 followed by the formation of an N+ type region 16 in the well which functions as the source and another N+ type region 18 which functions as the drain. The region 14a in the well 14 intermediate the source 16 and drain 18 region functions as the cell channel region.

A polysilicon floating gate 20 is disposed over the channel region 14a and is insulated from the channel region by a thin gate oxide 22. A polysilicon control gate 24 is disposed over the floating gate 20 and is insulated from the floating gate by an interpoly dielectric layer 26.

FIG. 1A also illustrates typical voltages which can be applied to cell 10 in order to program the cell. A relatively large positive voltage, +12 volts for example, is applied to the control gate 24. An intermediate voltage, +6 volts for example, is applied to the drain region 18 and the source region 16 is grounded. The P well 14 is biased to ground level by way of a P+ contact 28.

Figure 1B:
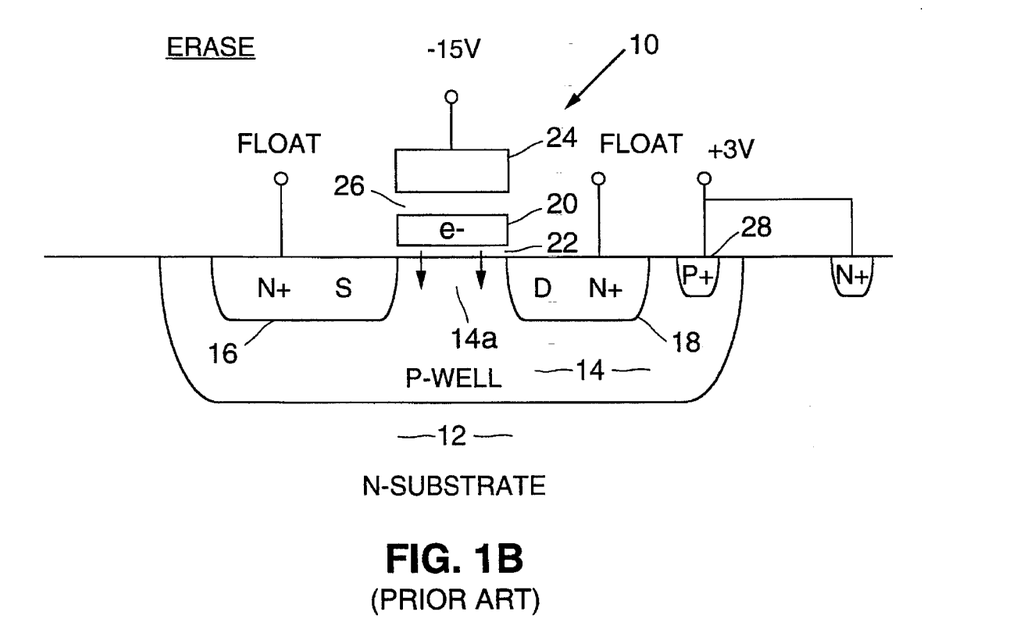
FIG. 1B depicts a conventional flash memory cell and typical voltages used for erasing the cell.

The large positive voltage applied to the control gate 24 causes hot electrons to be injected from the source region 16 towards the drain region 18. The electrons pass through the gate oxide 22 in that portion of the channel region 14a near the drain region 18 and into the floating gate 20. As will be explained later, the presence of the negative charge on the floating gate alters the threshold voltage of the cell thereby indicating that the cell has been programmed. Cell 10 will remain programmed until it is erased as depicted in FIG. 1B. Although the predominate mechanism for the programming mechanism is hot electron injection, other mechanisms also occur.

Referring to FIG. 1B, this figure shows typical voltages for erasing cell 10. The source region 16 and the drain region 18 are left open (floating) and an intermediate positive voltage, +3 volts for example, is applied to the P-well 14. A relatively large negative voltage, typically −15 volts, is applied to the floating gate 24. These voltages cause electrons to be transferred from the floating gate 20 and through the thin gate oxide 22 and into the positive P-well along the channel 14a. The predominate mechanism for erasing in the manner previously described is commonly referred to as cold electron injection or Fowler-Nordheim tunneling. In the case of a flash memory array, all cells are usually erased in bulk, that is, individual cells are not erased. For more recent memory architectures, it is possible to erase the memory on a row by row basis.

Figure 1C:
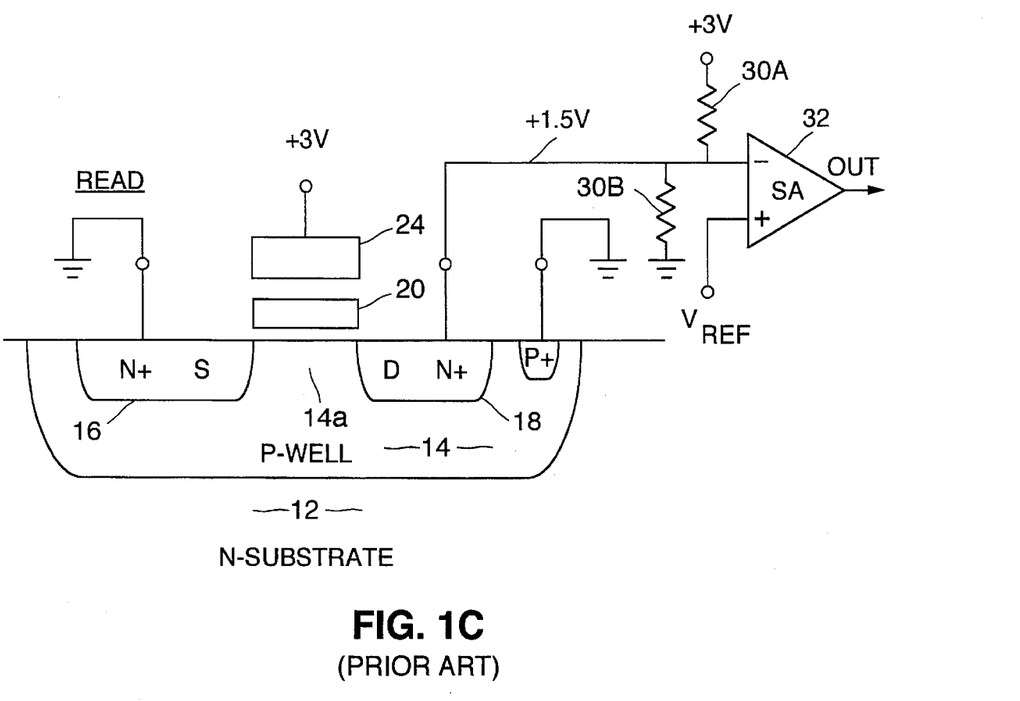
FIG. 1C depicts a conventional flash memory cell and associated sense amplifier together with typical voltages used for erasing the cell.

FIG. 1C depicts the manner in which cell 10 is read. The drain region 18 is connected to an intermediate level positive voltage, such as +3 volts, by way of a load impedance represented by resistors 30A and 30B. The resistors divide down the +3 volts to approximately +1.5 volts at the drain region 18. An intermediate positive voltage, such as +3 volts, is applied to the control electrode 24 and the source region 16 is grounded.

In the event the cell 10 has not been previously programmed, the cell will have an erased threshold voltage VtErase which is relatively low. The voltage applied to the cell will be sufficient to invert the channel 14a, that is, to render the cell 10 conductive. A current will be drawn through load 30A/30B and will produce a voltage at the inverting input of a sense amplifier 32, also connected to the drain region 18, which is less than the +1.5 volts present when the cell is non-conductive at a reference voltage VRef. The output of the sense amplifier will change state thereby indicating that the cell had not been programmed but, rather, was in the erased state.

In the event cell 10 had been previously programmed, the negative charge present on the floating gate 20 due to the presence of electrons will increase the threshold voltage of the cell. The increased threshold voltage, referred to as VtWrite, will prevent the cell 10 from becoming conductive when the voltages of FIG. 1C are applied. Thus, the voltage applied to the inverting input of amplifier 32 will remain high at +1.5 volts. Reference voltage Vref is selected to be less than +1.5 volts so the amplifier output will remain unchanged indicating that the cell had been programmed.

Figure 2:
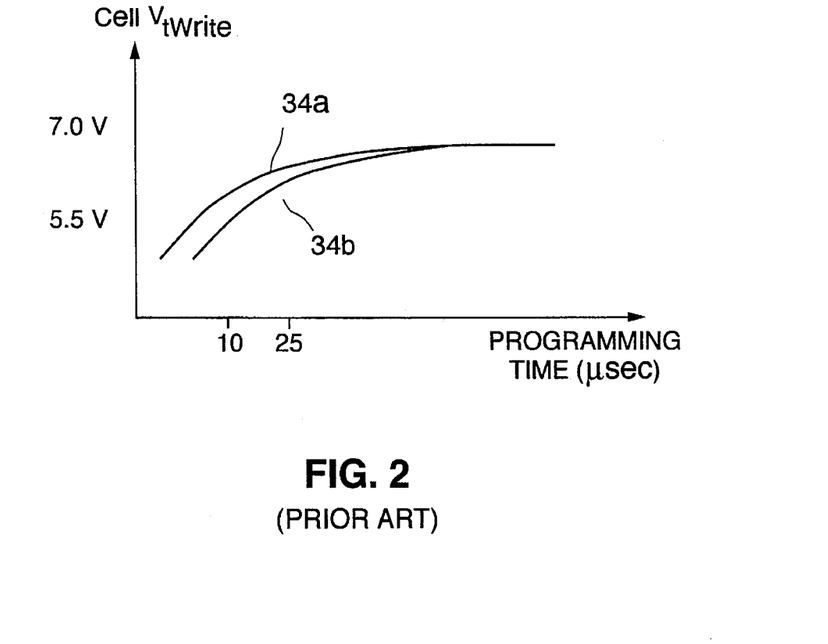
FIG. 2 is a graph showing the distribution of the threshold voltages of programmed flash memory cells versus programming time.

Cell 10 is programmed by applying the programming voltages for some period of time in the form of a programming pulse. FIG. 2 is a graph indicating programming time (in terms of microseconds) versus programmed threshold voltage VtWrite. Curves 34a and 34b represent the distribution of threshold voltage VtWrite among a population of cells for a given program pulse width. It can be seen from these curves that there is a fairly wide distribution of threshold voltages VtWrite for short programming pulses with the two curves 34a and 34b converging at a higher voltage when the pulse width is on the order of a 100 microseconds or more.

Figure 3:
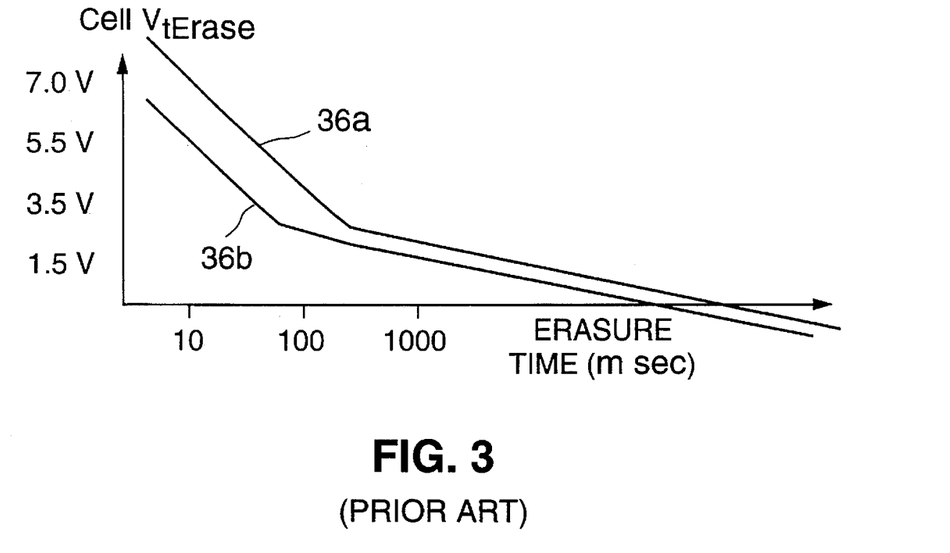
FIG. 3 is a graph showing the distribution of the threshold voltages of erased flash memory cells versus erase time.

FIG. 3 is a graph showing the distribution of erase threshold voltages VtErase versus time in terms of milliseconds. Curves 36a and 36b represent the distribution of erase threshold voltages VtErase for a population of cells. As can be seen, the distribution becomes somewhat smaller and the absolute voltage less as the duration of the erase pulse increases.

Figure 4:
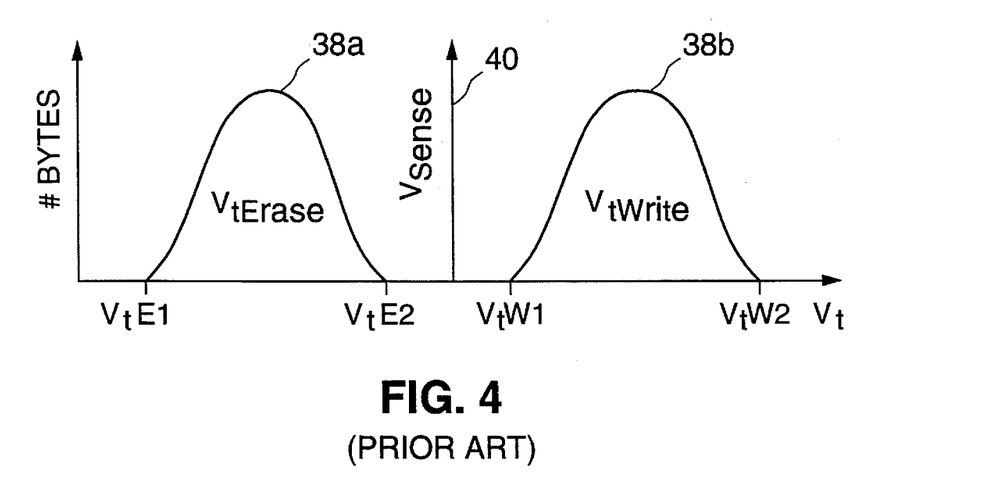
FIG. 4 is a graph showing the distribution of a population of programmed flash memory cells and erased flash memory cells.

FIG. 4 is a further graph, with the horizontal axis representing the threshold voltage Vt and the vertical axis representing the number of cells in a memory array expressed in terms of Bytes. Curve 38a depicts the distribution of erase threshold voltages VtErase for a population of erased cells in a particular memory array. All threshold voltages fall between a minimum value VtE1 and a maximum value VtE2, with the majority of cells falling approximately midrange between the two.

Curve 38b of FIG. 4 depicts the distribution of write (program) threshold voltage VtWrite for a population of programmed cells. All threshold voltages fall between a minimum value VtW1 and a maximum value VtW2, with the majority of cells falling approximately midrange between the two values.

Curve 40 of FIG. 4 represents the reference voltage VSense which is related to reference voltage VRef (FIG. 1C) which is used to sense whether a cell has been programmed during a read operation. Ideally, the entire population of all cells in an array has a single fixed threshold voltage VtErase and a single fixed threshold voltage VtWrite which is greater than VtErase by some fixed magnitude so that the programmed state of the cells can be reliably ascertained. However, the mechanisms which determine the two threshold voltages have a dependency on time (program and erase pulse duration), voltage (program and erase pulse amplitude), process profile and other variables. These factors cannot be tightly controlled, therefore flash memory cells inherently possess a wide threshold voltage distribution.

It is particularly desirable to have a narrow VtErase distribution, especially in low voltage applications. Conventional flash memory systems utilize circuitry for checking the maximum VtErase voltage (VtE2 of FIG. 4) for cells in a particular array. However, such systems have no means for confirming the minimum threshold voltage VtE1 of the array.

The present invention overcomes the above-noted shortcomings of conventional flash memory arrays. The minimum threshold voltage VtE1 can be verified. In addition, the actual erased threshold voltage VtErase can be adjusted so as to control and reduce the VtErase distribution. These and other advantages of the present invention will become apparent to those skilled in the art upon a reading of the following Detailed Description of the Invention together with the drawings.

SUMMARY OF THE INVENTION

A flash memory system capable of erasing the memory cells to an erased threshold voltage that falls between a target maximum threshold voltage and a target minimum threshold voltage. The system includes an array of flash memory cells, with each of the cells having an adjustable threshold voltage.

The system includes means for controlling the operation of the memory system, including programming means for programming the cells of the array, reading means for reading the cells of the array and erasing means for erasing the cells of the array. The easing means comprises reducing means for reducing the threshold voltages of the cells of the array to a value less than the target maximum erased threshold voltage, first testing means for testing the cells of the array to determine whether any cells of the array have a threshold voltage less than the target minimum erased threshold voltage, increasing means for increasing the threshold voltage of the cells of the array in the event the first testing means ascertains that any of the cells have a threshold voltage less than the target minimum erased threshold voltage and second testing means for testing the cells of the array to determine whether any of the cells have a threshold voltage greater than the target maximum erased threshold voltage.

In operation, the reducing means preferably reduces the threshold voltage by incrementally erasing the cells one step at a time until all of the cells have a threshold voltage less than the target maximum. When this occurs, it is possible that one or more cells will have a threshold voltage less than the target minimum. The first testing means then functions to measure the threshold voltage of all of the cells to determine whether any of the threshold voltages have been reduced to less than the target minimum. If that is the case, the increasing means will increase the threshold voltage. This is preferably done by incrementally programming the cells using relatively soft programming pulses.

After each soft programming pulse, the cells are tested by a second testing means to determine whether any of the threshold voltages exceed the target maximum. If the test is negative, the first testing means will test to determine whether the increasing means has caused any of the threshold voltages to exceed the target maximum value. If that is not the case, the erasing process is completed and the cells of the array will all have an threshold voltage which falls between the maximum and minimum target values.

DETAILED DESCRIPTION OF THE INVENTION

Figure 5:
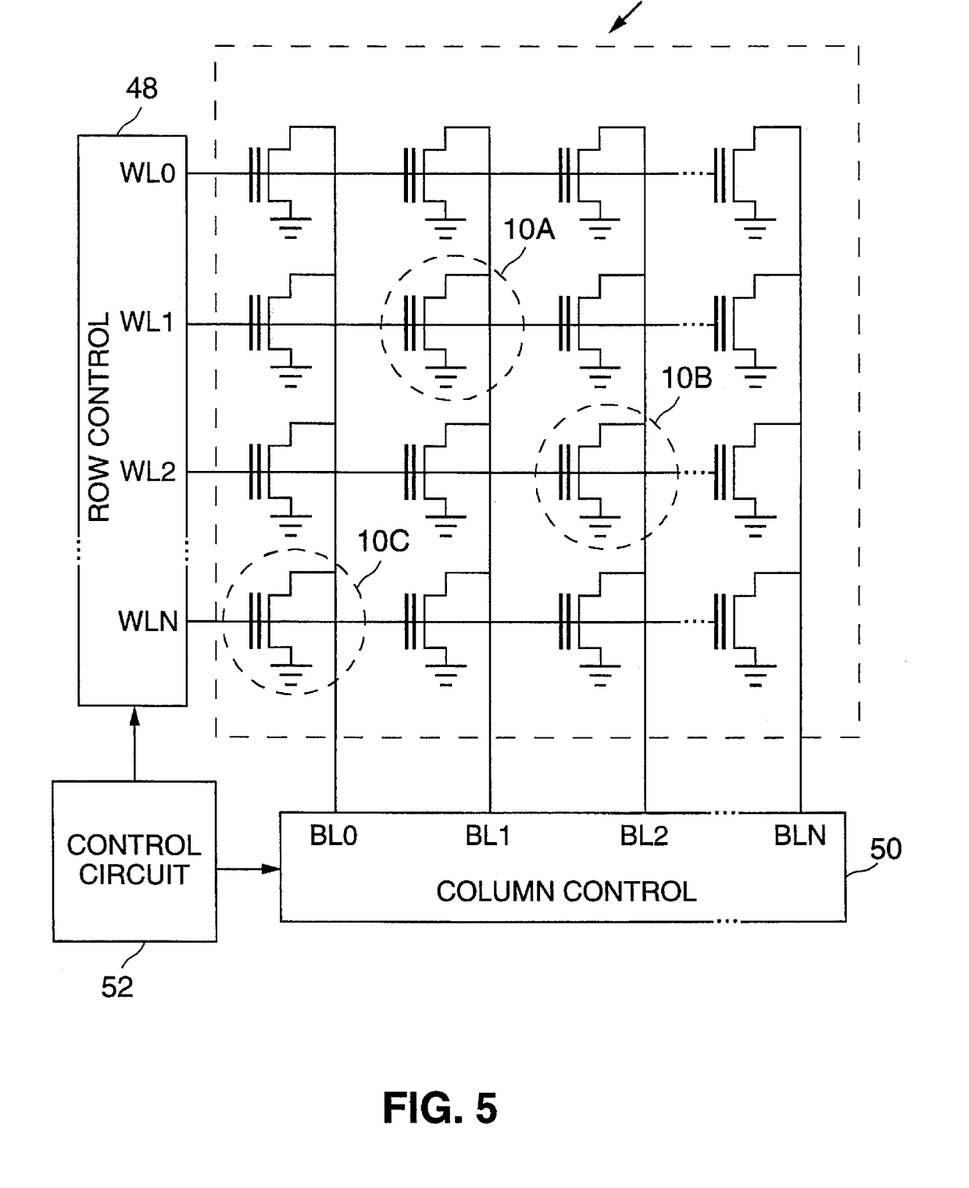
FIG. 5 is a flash memory system of the type which can incorporate the subject invention.

Referring again to the drawings, FIG. 5 shows a memory system which includes an array 46 of individual flash memory cells 10. The cells are arranged in rows and columns, with all of the cells in a row having their control gate connected to a common word line WLN. The drains of the cells located in a particular column are all connected to a common bit line BLN. The sources of all of the cells of the array are connected to the circuit common.

The memory system includes a Row Control block 48 connected to the word lines WLN of the cells of the array and a Column Control block 50 connected to the bit lines BLN of the array. The system further includes a Control Circuit 52 which receives, among other things, the address of a particular cell to be programmed or read. Control Circuit 52 functions to cause the two control blocks 48 and 50 to apply the appropriate voltages for programming, reading and erasing the cells as depicted in FIGS. 1A–1C. Control Circuit 52 also functions to cause the two blocks to perform the function to be subsequently described of controlling the erased threshold voltage of the array 46.

Figure 6:
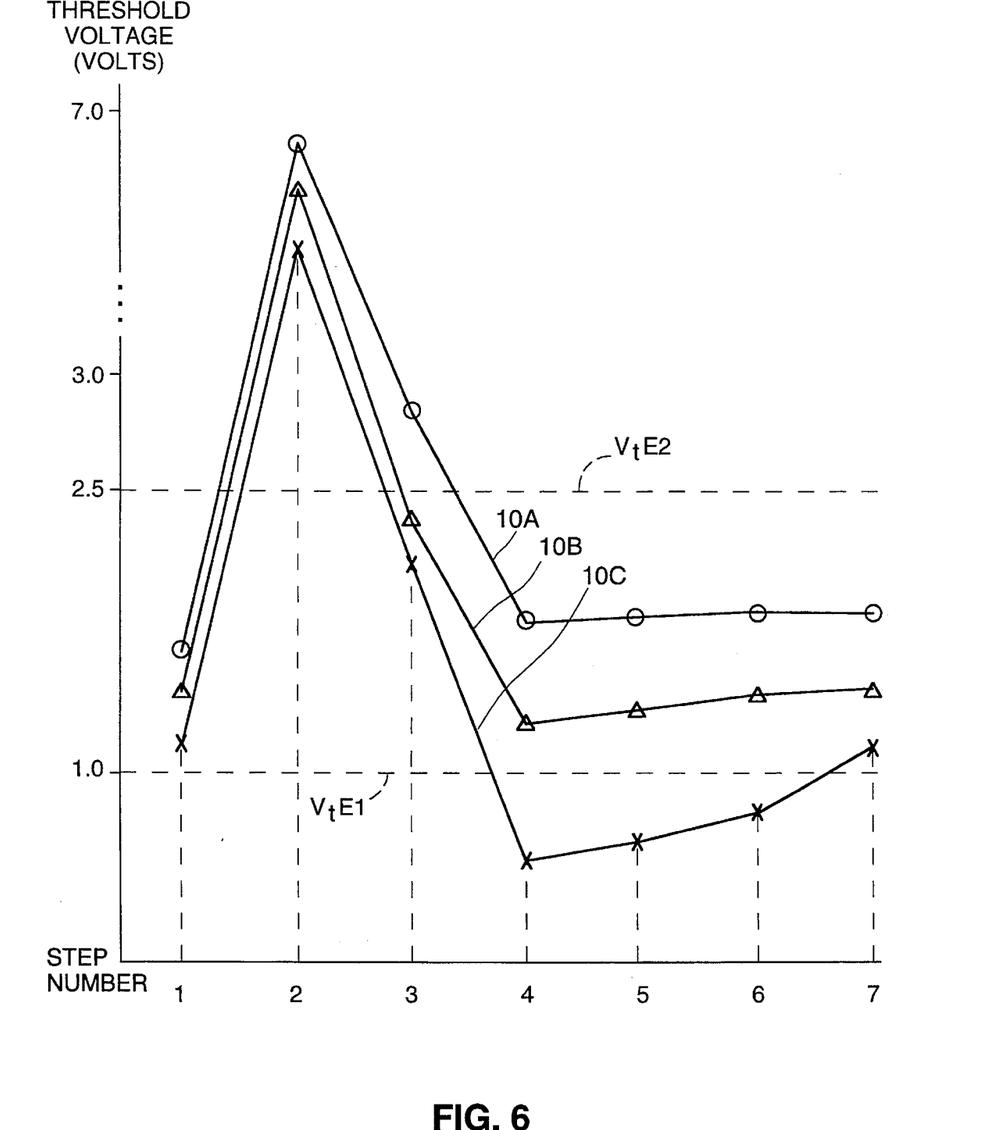
FIG. 6 is a graph showing the threshold voltage of three exemplary flash memory cells of a typical memory array as the cells subjected to the steps for carrying out the subject invention.
Figure 7:
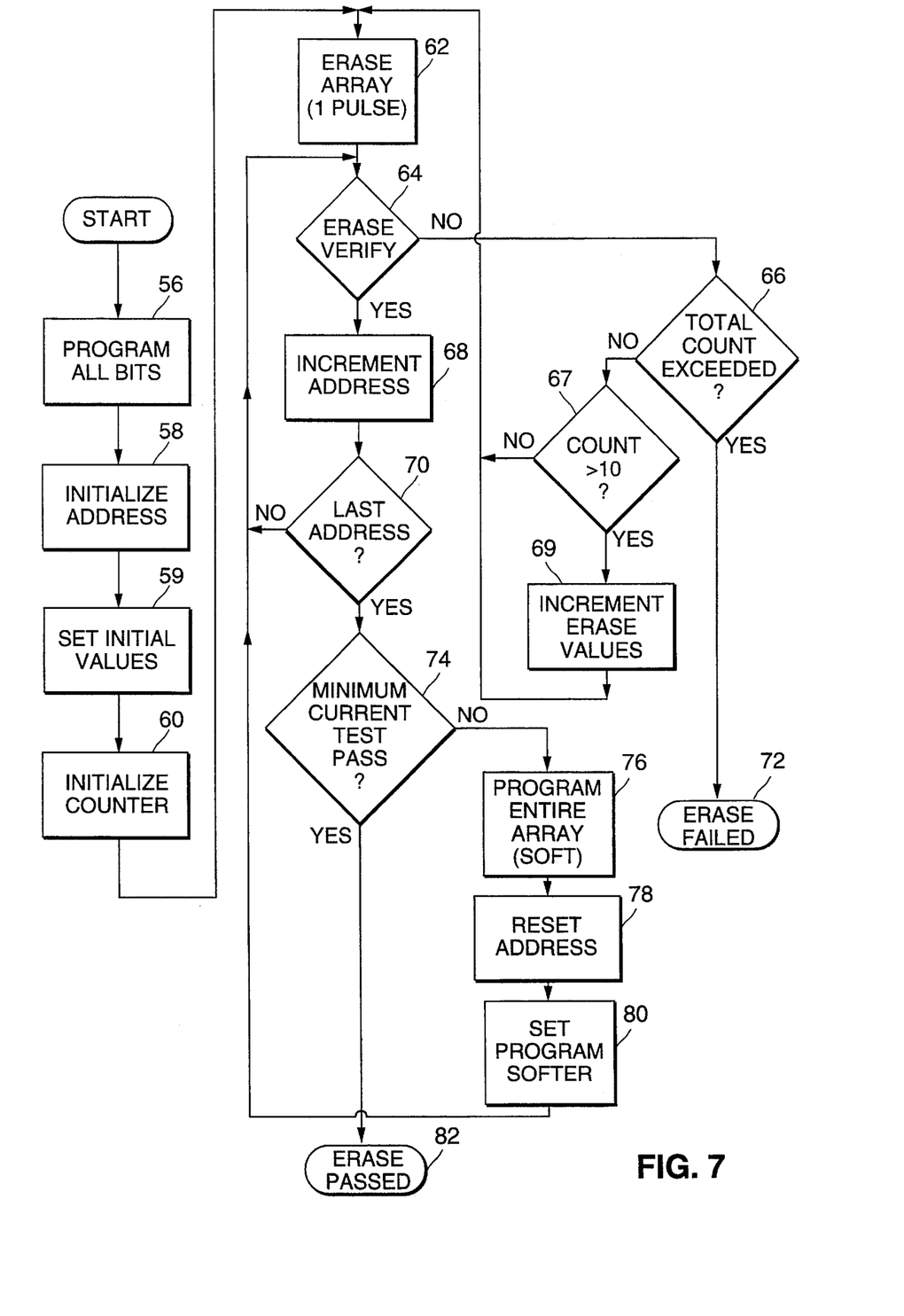
FIG. 7 is a flow chart depicting the steps for carrying out the subject invention.

FIG. 7 is a flow chart illustrating the control steps taken out under the control of the Control Circuit 52. The flow chart will be described in connection with the graph of FIG. 6 which shows the threshold voltages for three exemplary cells 10A, 10B and 10C of a typical FIG. 5 array 46. The vertical axis of the graph represents the threshold voltage of the cells and the horizontal axis represents the particular step in the process that results in the threshold voltage. The term threshold voltage is used here to mean the gate-source voltage applied to the cell which results in a cell current of one micro-ampere.

The objective is to erase in a controlled manner such that all of the cells of the array 46 have an erased threshold voltage VtErase that fall between a predetermined minimum VtE1 target and a predetermined maximum VtE2 target. In the present example, the minimum target is +1 volt and the maximum target is +2.5 volts, such values being typical for a primary supply voltage of +3 volts.

The array is initialized, typically at the manufacturing facility, so that the array is effectively in a completely erased state. This is a conventional step which, in the present example, results in threshold voltages ranging from +1 to +2 volts. The graph of FIG. 6, at Step 1, shows the threshold voltage for exemplary cells 10A, 10B and 10C which fall within this range. Note that there is a distribution of threshold voltages for the three examples even in this step of the sequence.

As indicated by block 56 of FIG. 7, the entire array is programmed thereby increasing the threshold voltage of the cells. The programming can be carried out utilizing voltages such as shown in FIG. 1A. The duration of the +12 volt program pulse applied to the drain and control gate is typically 100 microseconds. As can be seen in FIG. 6, Step 2, the cells are all programmed to a relatively high state of approximately +6 volts. Again, it can also be seen that there is a distribution of about 1 volt for the three exemplary cells at this stage of the sequence.

It is also possible to program the entire array utilizing the adaptive programming technique disclosed in co-pending application Ser. No. 08/349,787 entitled "FLASH MEMORY HAVING ADAPTIVE SENSING AND METHOD" and filed on the same date as the present application, the contents of which are fully incorporated herein by reference. As explained in greater detail in this co-pending application, the memory array includes a column of programmed reference cells and a column of erased reference cells. When a cell in a particular row is to be programmed, the threshold voltages of the programmed and erased referenced cells in the same row are measured and used to determine the optimum programming pulse voltage and pulse duration. By controlling the programming pulse in this manner, the distribution of the programmed threshold voltage of the cells in the array is reduced.

The next step of the erase sequence is to commence the erasure of the entire array by applying a single erase pulse to all of the cells and then measuring the threshold voltage of the cells. First, a memory cell address register is reset to the first address of the array 46 (block 58 of FIG. 7). In addition, the initial values to be used in the first portion of the erase sequence are set. Typically, initial voltage Vee is −13 volts and the initial pulse width is 50 milliseconds. As indicated by block 60, an internal counter is also initialized at this point for the purpose of keeping track of the number of erase pulses used in the erase sequence.

A single erase pulse is then applied to the cells of the array as indicated by block 62. The erase pulse will cause the threshold voltage of the cells to decrease a fraction of a volt. Typically, a total of about twenty-five erase pulses will be required for the desired level of erase. Once a single erase pulse has been applied, the first cell of the array, i.e., the cell associated with the first address, is tested to determine whether the cell threshold voltage has dropped below the target maximum VtE2 of +2.5 volts. This erase verify step, as indicated by element 64 of FIG. 7, is similar to a cell reading sequence.

Although the Erase Verify test is carried out on a single cell, it can be carried out on a group of cells depending upon the actual architecture of the memory system. For example, if the minimum addressable number of cells is eight (a byte), then it would be satisfactory to Erase Verify that number of cells.

Figure 8:
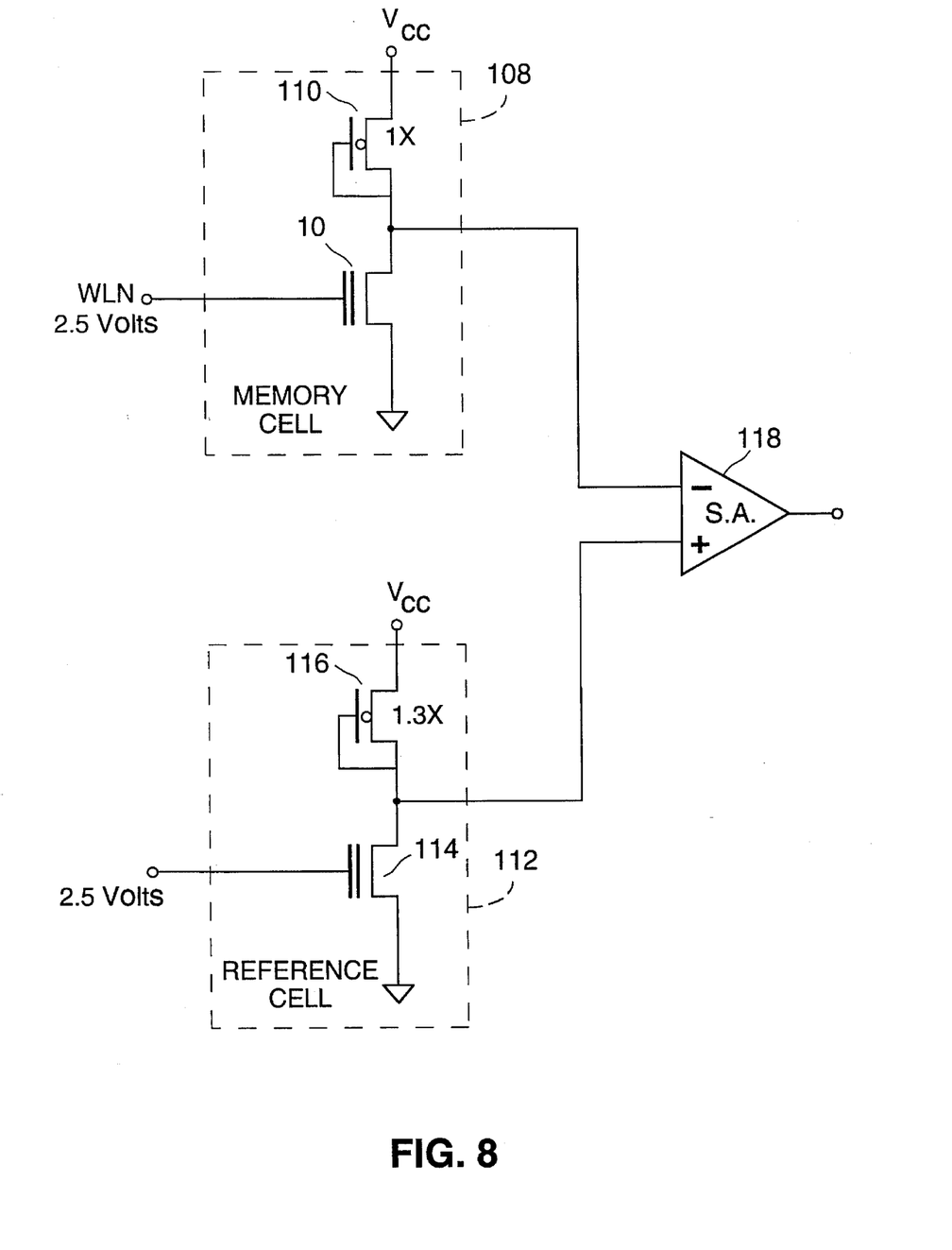
FIG. 8 is a schematic diagram showing an exemplary circuit for measuring the target maximum erased threshold voltage.

FIG. 8 is a simplified schematic diagram of one circuit which can be used in carrying out the Erase Verify step. The circuit 108 includes the particular cell 10 being verified connected to a P channel load 110 having a geometry W/L of 1X. Other cells 10 in the same column, which are not depicted, are connected to the same load. A reference cell circuit 112 includes a reference cell 114 which has been erased at the factory by U.V. and has an erased threshold voltage of typically 2.0 volts. Reference cell 114 is connected to a P channel load 116 having a geometry W/L of 1.3X. A voltage of +2.5 volts is applied to both the cell 10 being verified and the reference cell 114. The outputs of the two circuits 108 and 112 are connected to the inverting and non-inverting inputs of a comparator circuit (sense amplifier) 118. Comparator 118 is the same comparator used in all memory read operations. The difference in threshold voltages between the memory cell 10 and the reference cell 114 is compensated for by the difference in load transistor 110 and 116 geometry so that output voltages will be equal when the threshold voltage of cell 10 is at 2.5 volts.

Assuming that the memory cell 10 being verified has a threshold voltage of more than 2.5 volts, the cell will not be sufficiently erased. In that event, the voltage applied to the inverting input of comparator 118 will be greater than that applied to the inverting input so that the comparator output will be at a low or inactive state. In the event the cell 10 has been erased down to the desired threshold level of +2.5 volts, the inverting comparator input will be equal to or less than the non-inverting input so that the comparator output will be active.

Since only a single erase pulse have been applied at this step, the selected cell 10 will almost certainly not have been erased sufficiently to cause the threshold voltage to drop below the target of +2.5 volts. Accordingly, the first cell will have failed the Erase Verify test. A determination is then made as to whether a predetermined maximum number of erase pulses have been applied to the cell 10 being erased (element 66). If the number, typically 1024, has been exceeded, an anomaly has occurred and the erase sequence is terminated (element 72).

Assuming that the maximum number has not been exceeded, a determination is then made as to whether the magnitude of the erase pulse voltage should be increased (element 67). Typically, a total of 10 erase pulses are applied to the array before the magnitude is changed, assuming that the pulses previously applied were insufficient to erase the cell to the desired target of +2.5 volts or below. It is preferable to begin the erase sequence with relatively low magnitude erase pulses so as to reduce the stress to the cells which results from repeated memory program/erase operations (memory cycling). Once a cell has been subjected to a certain number of low magnitude erase pulses, the cells are less subject to the adverse effects of memory cycling. Accordingly, once low magnitude erase pulses have been applied, it is then possible to increase the magnitude of the erase pulse voltage. This functions to minimize the amount of time required to accomplish the erase sequence without subjecting the memory array to undue stress.

Assuming that less than 10 pulses have been applied, a further erase pulse is applied to all of the cells 10 as indicated by block 62. This sequence will continue until the first cell addressed has either been programmed to the desired level or until a total of 10 pulses have been applied to the array.

Typically, 10 pulses at the initial low erase pulse magnitude will be insufficient to accomplish the erase. In that event, the magnitude of the negative erase pulse will be increased an incremental magnitude. Typically, the increase will be on the order of 0.5 volts, in which case the erase pulse will change from −13 volts to −13.5 volts. In addition, it is desirable to decrease the pulse duration from 50 milliseconds to 25 milliseconds. The new value erase pulse will then be applied to the entire array (block 62) and the first address cell will be tested again (element 64).

This sequence will continue until either the first address cell has passed the Erase Verification test or until a total of 10 pulses have been applied as indicated by element 67. If a total of 10 pulses has been applied, the magnitude of the erase voltage is again increased by 0.5 volts and the greater magnitude pulses are applied to the entire array. It is usually preferable that the duration of the erase pulses be reduced from 25 milliseconds to 10 milliseconds.

A method of selecting an optimum amount to increase the magnitude of the erase pulse voltage in this portion of the erase sequence is disclosed in the above-referenced co-pending application Ser. No. 08/349,787 entitled "FLASH MEMORY HAVING ADAPTIVE SENSING AND METHOD".

The first address cell will eventually pass the Erase Verification test in which case the memory address will be incremented to the next address as indicated by block 68. A determination will then be made as to whether all of the memory addresses have been tested, as indicated by element 70. Since that is not the case, the sequence will return to the Erase Verify test (element 64) at which time the second address cell of the array will be tested. At this point in the erase sequence, it is likely that some of the cells 10 will be below the target maximum threshold voltage VtE2 as indicated as Step 3 of the FIG. 6 graph. As can be seen, both cells 10B and 10C are below the maximum value, but cell 10A remains above this value.

Returning to the FIG. 7 flow chart, assuming that the second cell did not pass the Erase Verification test (exemplary cell 10A would not at this stage), and assuming that less than 10 pulses have been applied (element 67), the sequence will return to block 62 and the entire array will be subjected to a single erase pulse using the same erase pulse magnitude used in with the previous erase. The second cell is again subjected to the Erase Verify test. Assuming that it eventually passes the test, the address will be incremented (block 68) and the third cell will be tested. This sequence will continue until either all cells pass the Erase Verify test or until some predetermined maximum erase pulses have been used. As previously explained, if the maximum number has been exceeded, a failure has occurred and the sequence will terminate (element 72).

Referring again to FIG. 6, Step 4 shows typical threshold voltages of the three exemplary cells 10A, 10B and 10C at this stage of the erase sequence. It can be seen that the threshold voltage of all three cells has dropped below the target maximum VtE2 value of +2.5 volts. Since each cell of the array is subjected to the same erase pulses required to reduce the threshold voltage to below the target of +2.5 volts, the cells with the lowest initial programmed threshold voltage at Step 2 will tend the have the lowest erased threshold voltage after erase. By way of example, at Step 4 it can be seen that the threshold voltage of cell 10C will have a threshold voltage of about +0.5 volts, lower than the target minimum erased threshold voltage VtE1 of +1 volt and lower than the other exemplary cells 10A and 10B.

As can also be seen from FIG. 6, Steps 2 to 4, the distribution of the threshold voltages widens as the cells are erased. This is due primarily to the fact that the difference in programmed threshold voltages at Step 2 is attributable to a difference in the number of electrons present on the respective floating gates of the cells 10. When the cells are erased, the actual potential applied to the floating gates is dependent, in part, on the floating gate charge. Those cells having a larger charge after programming, such as cell 10A, will respond more readily to the negative erase voltage Vee and will manifest a greater rate of decrease in threshold voltage for a given erase pulse than do cells having a smaller floating gate charge in the programmed state, such as cell 10C. Thus, as can be seen from FIG. 6, the dispersion between the threshold voltages actually increases as the cells are erased. It is a principal object of the present invention to decrease this erased threshold voltage dispersion.

When all of the cells of the array have passed the Erase Verification test (element 64 of FIG. 7), a determination is made as to whether any of the erased cells have an erased threshold voltage which is less than the target minimum erased threshold voltage VtE1. The minimum value is +1 volt in the present example. This is accomplished by way of a Minimum Current test, indicated by element 74.

The Minimum Current test is accomplished by applying a voltage equal to the target maximum VtE1, +1 volts, to all of the word lines WLN of the array and applying a predetermined positive voltage to all of the bit lines BLN connected to the drains of the cells. In the event one or more cells 10 has been erased to a threshold voltage of less than +1 volt, such cells will become conductive and a minimum leakage current of one microamp per cell will flow through the array.

Figure 9:
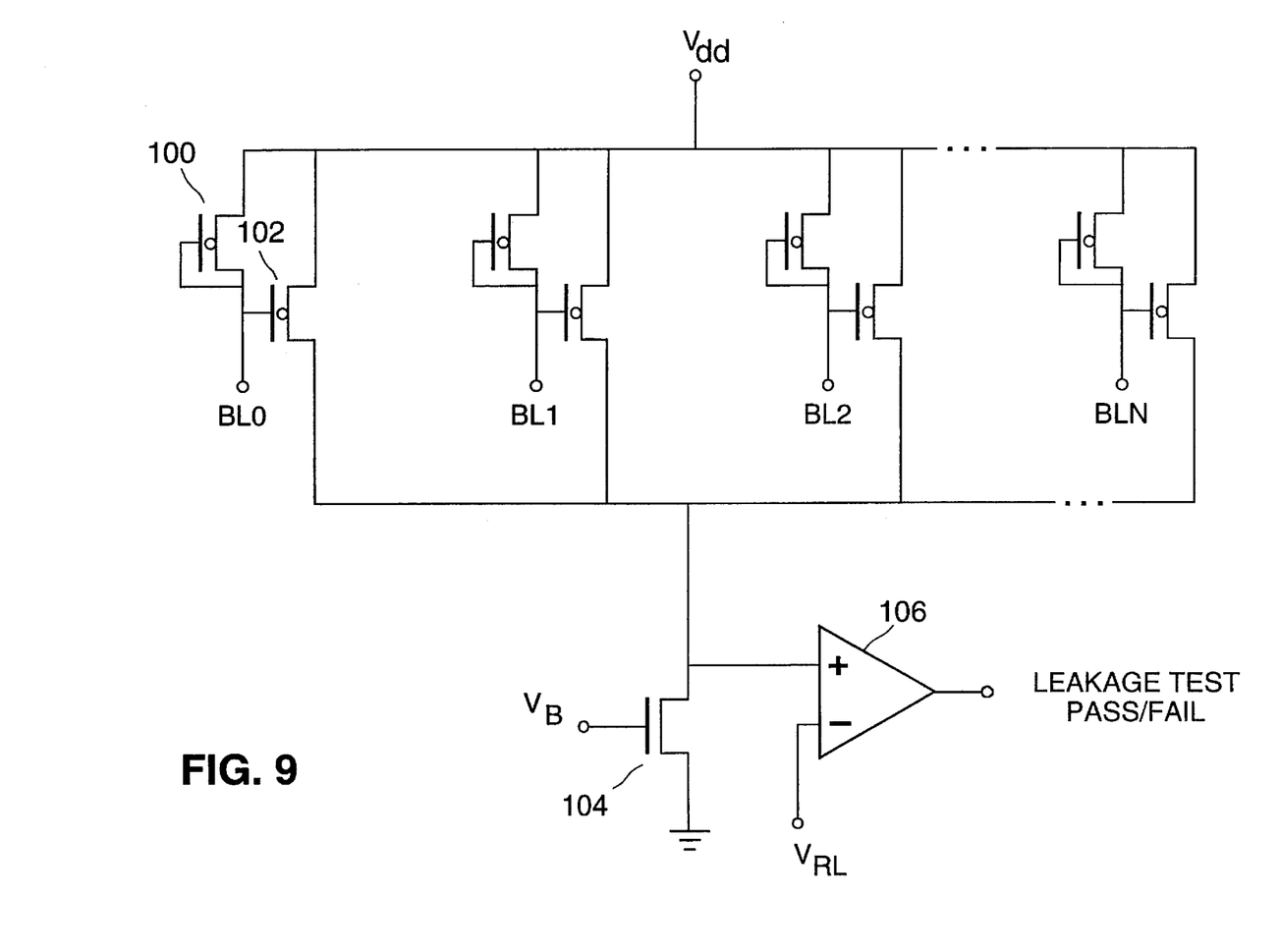
FIG. 9 is a schematic diagram of one embodiment of a circuit for measuring the current flow through all of the memory cells of the memory array.

FIG. 9 is a schematic diagram of one embodiment of an exemplary circuit located in the Column Control 50 for carrying out the Minimum Current test. The circuit is capable of very accurately measuring current flow through any cell of the array. A pair of P channel FETs, configured as a current mirror, are associated with each column of the array. By way of example, the column connected to bit line BL0 has a FET 100 connected thereto which will conduct the total amount of current flowing through the cells located in that column. That current will be mirrored in FET 102. FETs 100 and 102 have a W/L ratio of 20/1 so that the current flow through FET 102 will be twenty times that of the actual current flowing through bit line BL0.

The amplified bit line current of all of the cells is combined in a single N channel FET 104 which is biased by voltage VB. The voltage across FET 104 is compared by a comparator 106 to a predetermined reference VRL. If the current in transistor 104 indicates that at least one cell of the array is conducting, the output will indicate that the Minimum Current test has failed.

If the test is passed, the array has been successfully erased, with all of the cells 10 falling between the target maximum erased threshold voltage VtE2 and the target minimum erased threshold voltage target VtE1. The erase sequence is then concluded as indicated by element 82. In most cases, however, the first Minimum Current test will fail. The state of the exemplary cells 10A, 10B and 10C at Step 4 of the FIG. 6 graph indicates that at least cell 10C has been erased to a threshold voltage of less than the VtE1 value of +1 volts. In that event, a soft program pulse will be applied to the entire array as indicated by block 76. It is important that the soft programming mechanism be Fowler-Nordheim tunneling (cold electron injection) as opposed to hot electron injection as described in connection with FIG. 1A. Such soft program pulse includes the application of +15 volts to all of the word lines WLN of the array which are connected to the control gates 24 of the cells. In addition, the bit lines BLN connected to the drains of the cells are all grounded. The duration of the soft programming pulse is typically 100 milliseconds.

As can be seen at Step 5 of the FIG. 6 graph, the soft programming pulse will increase the threshold voltage for all of the cells of the typical array, including the three exemplary cells 10A, 10B and 10C. Once the single soft programming pulse is applied, it is necessary to confirm that none of the threshold voltages have been increased to more than the target maximum erased threshold voltage VtE2 of +2.5 volts. This is done by resetting the cell addresses to zero as indicated by block 78. In addition, the strength of any additional programming pulses is reduced as indicated by block 80 in the event such pulses are to be applied. By decreasing the strength of the subsequent programming pulses, there is a reduced likelihood that the programming pulses will cause the threshold voltage of any of the cells 10 to overshoot the target maximum VtE2 value.

The Erase Verify test (element 64) will be conducted on each cell on a cell-by-cell basis starting with the first cell address to confirm that the target maximum threshold voltage VtE2 has not been exceeded. Assuming that all cells pass the test, the Minimum Current test (element 74) will again be conducted on all cells. As can be seen from Step 5, exemplary cell 10C will again fail the test. Accordingly, all cells will be softly programmed by application of an even softer programming pulse. The exemplary cells 10 of FIG. 7 indicate at Step 6 that cell 10C is still below the target minimum erased threshold voltage VtE1 level so that the Minimum Current test will again fail.

This sequence will continue until either all of the cells have been erased/softly programmed to fall between VtE2 and VtE1 or until the number of applied erase pulses exceeds a predetermined number (element 66) such as 1024. It is important to note that the Fowler-Nordheim tunneling mechanism used for the soft programming (block 76) will have a greater influence on those cells having the lowest erased threshold voltage at Step 4. Thus, for example, cell 10C will program more readily than cell 10B and cell 10B will program more readily than cell 10A. This is because the lower threshold voltage cells have fewer electrons present on the floating gate than do the higher threshold voltage cells. Thus, for the same control gate-to-drain voltage, the potential of the electric field across the gate oxide 22 (FIG. 1A) of low threshold voltage cells will be greater than the electric field across the gate oxide 22 of the higher threshold voltage cells. The greater field strength will result in more electrons being attracted to the floating gate of the cell by way of Fowler-Nordheim tunneling than are attracted to the floating gate of the cells having a weaker field strength.

Accordingly, the threshold voltage of cell 10C will increase more than that of cell 10B and cell 10B will increase more than that of cell 10A. As the cells are softly programmed, it can be seen from Steps 5, 6 and 7 of FIG. 6 that the threshold voltages tend to converge. Thus, the dispersion of the erased threshold voltage of the cells of the array is reduced.

It should also be noted that it is preferable that the Erase Verify test (element 64) be done on only one or, depending on the memory architecture, a few number of cells at a time whereas the Minimum Current test (element 74) can be done on the entire array at one time. It would be desirable to simultaneously test as many cells as possible under either test so as to reduce the time required to complete the sequence, especially when large arrays are involved. However, when the cells are being subjected to the Erase Verify test, it is necessary to confirm that all of the cells have a threshold voltage below VtE2, that is, all of the cells conduct a predetermined minimum current under the conditions shown in FIG. 8. This is preferably done on a cell-by-cell basis (or on a byte-by-byte basis where each bit of the byte is located in a separate column having a separate sense amplifier 118) rather than on a group of cells in a given array column since current flow through an adequately erased cell would tend to mask the lack of current flow through a cell that was not adequately erased. On the other hand, the purpose of the Minimum Current test is to confirm that none of the cells have been over erased. Thus, the presence of current flow through any cell is indicative of an over erase condition. Accordingly, it is possible to perform the Minimum Current test on a large group of cells or on the entire cell array since the masking problem associated with the Erase Verify test is not present.

Figure 10:
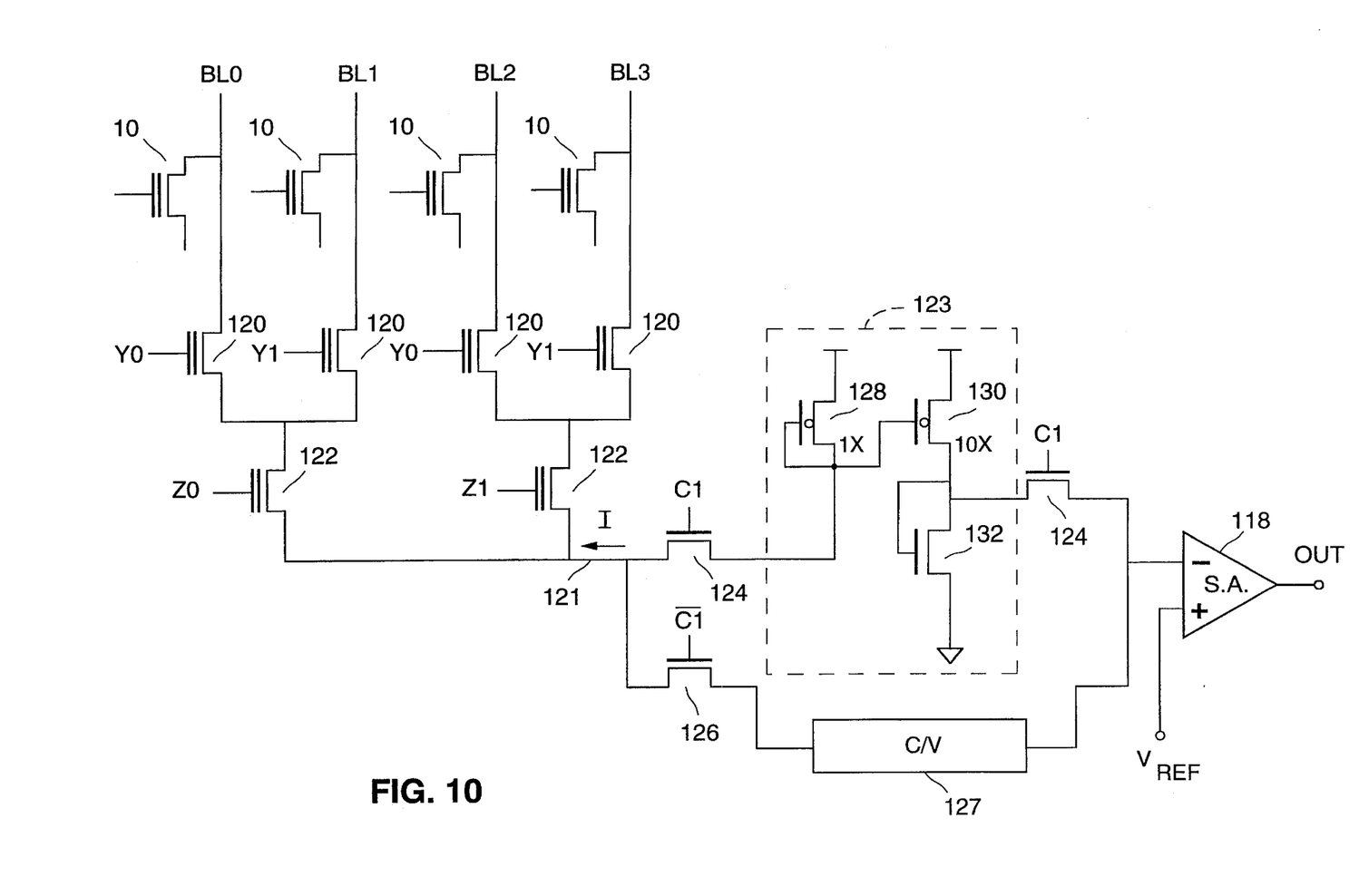
FIG. 10 is a schematic diagram of an alternative embodiment of a circuit for measuring the current flow through all of the memory cells of the memory array.

FIG. 10 depicts an alternative circuit for use in carrying out the Minimum Current test (element 74) which utilizes the same sense amplifier (comparator) used in normal read operations and the associated decoder transistors used in such operations. Four exemplary bit lines BL0–BL3 are shown, with each bit line having an single exemplary memory cell 10 connected thereto. Decoder transistors used in conventional memory reading and programming are also shown, including exemplary Y decoder transistors 120 and exemplary Z decoder transistors 122. These decoder transistors are normally used to select a particular column of memory cells for reading and programming, with the row of the target cell being selected by way of activation of the associated word line WLN (not shown).

The current output of the array on line 121 is selectively connected to a either a current amplifier 123 or to a sense amplifier 118 in the form of a comparator by way of a set of pass transistors 124 and 126. In normal operation, selected ones of the decoder transistors are activated so that only the bit line of the array where the target cell 10 is located is connected to the output line 121. Control signal $\overline{C1}$ is normally active and control signal C1 inactive so as to isolate the current amplifier 123 from the sense amplifier 118 and from the current output of the array on line 121. In addition, the current output is connected to a voltage-to-current converter 127 and the voltage output is connected to the input of the sense amplifier. Operation of the circuitry in this mode is conventional.

When the Minimum Current test is to be carried out, all of the word lines are connected to +1 volts and the bit lines are connected to a positive voltage. In addition, control signal $\overline{C1}$ is made active and signal C1 is made inactive so that the current amplifier 123 is connected in series between the current output line 121 and the sense amplifier. The decode signals YN and ZN are all made active so that all of the columns of the array are simultaneously connected to the current output line 121.

In the event one or more cells has a threshold voltage of +1 volt or less, a minimum amount of current will flow through the output line 121 and into the current amplifier 123. The current amplifier 123 will amplify the current by virtue of the difference in geometry of transistor 128, which has a W/L ratio of 1X, and transistor 130, which has a W/L ratio of 10X. The amplifier 123 output voltage is connected to the input to the sense amplifier 118 and is scaled so that the amplifier output will be active when a predetermined minimum amount of array current, typically one microamp is present.

Thus, a novel memory system array capable of providing erased cells having a well controlled erased threshold voltages with a narrow dispersion and related method have been disclosed. Although various embodiments have been described in some detail, it is to be understood that certain changes can be made by those skilled in the art without departing from the spirit and scope of the invention as defined by the appended claims. By way of example, reference has been made to an array of cells, but the term array should be interpreted to include one segment of a memory system cells which includes multiple cell segments.

I claim:

1. A method of controlling erased threshold voltages of a plurality of flash memory cells arranged in an array, each of the flash memory cells of said array including a control gate, a floating gate, a drain and a source, at least a majority of the flash memory cells having a threshold voltage adjusted to be greater than a target maximum erased threshold voltage, the method comprising the steps of:

reducing the threshold voltages of the cells until all of the cells have threshold voltages less than the target maximum erased threshold voltage, at least one cell having a threshold voltage that is both less than the target maximum erased threshold voltage and greater than a target minimum erased threshold voltage;

testing the cells, subsequent to the step of reducing and before any increasing step, to ascertain whether any of the cells have a threshold voltage less than the target minimum erased threshold voltage;

increasing the threshold voltages of the cells in the event any of the cells do have a threshold voltage less than the target minimum erased threshold voltage;

measuring the cells, subsequent to the step of increasing, to ascertain whether any of the cells have a threshold voltage less than the target minimum erased threshold voltage; and repeating the steps of increasing and measuring until all of the cells have a threshold voltage greater than the target minimum erased threshold voltage and less than the target maximum erased threshold voltage.

2. The method of claim 1 wherein the step of reducing the threshold voltages includes a step of erasing the cells predominately by way of cold electron injection.

3. The method of claim 2 wherein the step of increasing the threshold voltages includes a step of programming the cells predominately by way of cold electron injection.

4. The method of claim 3 wherein the step of testing is carried out on all the cells of the array simultaneously.

5. The method of claim 4 wherein the step of testing includes a step of measuring total current flow though all of the cells of the array.

6. The method of claim 5 wherein the step of testing includes a step of applying a gate-source voltage to the cells of the array which is equal to the target minimum erased threshold voltage of the array.

7. The method of claim 6 wherein the step of repeating includes a step of further testing to ascertain whether any of the cells of the array have a threshold voltage greater than the target maximum erased threshold voltage.

8. The method of claim 7 wherein said step of further testing includes a step of applying a gate-source voltage to the cells which is equal to the target maximum erased threshold voltage.

9. The method of claim 8 wherein the step of applying a gate-source voltage to the cells equal to the target maximum erased threshold voltage is carried out in multiple steps so that the gate-source voltage is not applied to all of the cells at the same time.

10. The method of claim 1 wherein the step of testing includes a step of applying a gate-source voltage to the cells of the array which is equal to the minimum target erased threshold voltage of the array.

11. The method of claim 10 wherein the step of repeating includes a step of further testing to ascertain whether any of the cells of the array have a threshold voltage greater than the target maximum erased threshold voltage.

12. The method of claim 11 wherein said step of further testing includes a step of applying a gate-source voltage to the cells which is equal to the target maximum erased threshold voltage.

13. The method of claim 12 wherein the step of applying a gate-source voltage to the cells equal to the target maximum erased threshold voltage is carried out in multiple steps so that the gate-source voltage is not applied to all of the cells at the same time.

14. A method of controlling erased threshold voltages of a plurality of flash memory cells arranged in an array, each of the flash memory cells of said array including a control gate, a floating gate, a drain and a source, at least a majority of the flash memory cells having a threshold voltage adjusted to be greater than a target maximum erased threshold voltage, the method comprising the steps of:

(a) erasing the cells of the array thereby reducing the threshold voltages of the cells;

(b) testing to determine whether any cells of the array have a threshold voltage greater than a target maximum erased threshold voltage;

(c) repeating the steps of erasing and testing until all of the cells have threshold voltages less than the target maximum erased threshold voltage, at least one cell having a threshold voltage that is both less than the target maximum erased threshold voltage and greater than a target minimum erased threshold voltage;

(d) testing, subsequent to said step (c) of repeating and before any programming step, to determine whether any of the cells of the array have a threshold voltage less than a target minimum erased threshold voltage;

(e) programming the cells of the array thereby increasing the threshold voltages of the cells in the event the step (d) of testing ascertains that one of the cells has a threshold voltage which is less than the target minimum erased threshold voltage;

(f) measuring the cells, subsequent to the step of increasing, to ascertain whether any of the cells have a threshold voltage less than the target minimum erased threshold voltage; and (g) repeating the steps (e) and (f) until none of the cells has a threshold voltage less than the target minimum erased threshold voltage.

15. The method of claim 14 and further including the steps of:

(h) testing, subsequent to step (g), to determine whether any cells of the array have a threshold voltage greater than the target maximum erased threshold voltage; and (i) erasing the cells of the array if it is ascertained in step (h) that cells of the array have a threshold voltage greater than the target maximum erased threshold voltage.

16. The method of claim 15 wherein the array of cells are arranged in rows and columns with all of the cells in one of the rows having their respective gates connected to a common word line and wherein the step (d) of testing is performed simultaneously on all cells located in one of the columns.

17. The method of claim 16 wherein the step (d) of testing is performed simultaneously on all cells of the array.

18. The method of claim 15 wherein the array of cells are arranged in rows and columns, with all of the cells in one of the rows having their respective gates connected to a common word line and wherein the step (d) of testing is performed simultaneously on all cells located in one of the rows.

19. The method of claim 18 wherein the step (d) includes a step of measuring a sum of current flow through all cells of the array.

20. A memory system including:

a plurality of flash memory cells arranged in an array with each of the cells including a source, a drain, a control gate, and a floating gate and having an adjustable threshold voltage;

control means for controlling the operation of the memory system, the control means including programming means for programming the cells of the array, reading means for reading the cells of the array and erasing means for erasing the cells of the array, with said erasing means comprising:

(a) reducing means for reducing the threshold voltages of the cells of the array until all of the cells have threshold voltages less than a target maximum erased threshold voltage, and so that at least one cell has a threshold voltage that is both less than the target maximum erased threshold voltage and greater than a target minimum erased threshold voltage;

(b) first testing means for testing the cells of the array to determine whether any of the cells have a threshold voltage less than a target minimum erased threshold voltage;

(c) increasing means for increasing the threshold voltages of the cells in an event the first testing means ascertains that any of the cells have a threshold voltage less than the target minimum erased threshold voltage;

(d) second testing means for testing the cells of the array to determine whether any of the cells have a threshold voltage greater than the target maximum erased threshold voltage, wherein said erasing means continuously reduces and increases the threshold voltages of the cells until the threshold voltages fall within a voltage range defined by the target maximum voltage and the target minimum voltage.

21. The memory system of claim 20, wherein the array of flash memory cells includes a plurality of word lines, wherein the array of flash memory cells are arranged in a multiplicity of rows and columns, with the control gates of all the cells located in one of the rows being coupled to a common word line, and wherein the first testing means includes, for each of the array columns, current means for simultaneously measuring a current flow through all of the cells of the associated column.

22. The memory system of claim 21 wherein each current means include a pair of transistors configured as current mirrors.

23. The memory system of claim 22 wherein the current mirrors are all connected to a common current summing node and wherein the first testing means causes a sum of the current flow of the array columns to flow through said current summing node.

24. The memory system of claim 23 wherein the first testing means causes a first predetermined gate-source voltage to be applied to all of the cells of the array.

25. The memory system of claim 24 wherein the first predetermined gate-source voltage is equal to the target minimum erased threshold voltage.

26. The memory system of claim 25 wherein the sources of all of the cells of the array are connected to a circuit common and wherein the target minimum erased threshold voltage is simultaneously applied to all the word lines of the array by the first testing means.

27. The memory system of claim 26 wherein the second testing means causes a second predetermined voltage which is equal to the target maximum erased threshold voltage to be applied to one of the word lines of the array.

28. The memory system of claim 27 wherein the second testing means causes the target maximum erased threshold voltage to be applied to only one of the word lines of the array at one time.

29. The memory system of claim 20 wherein the reducing means includes means for erasing the cells predominately by way of cold electron injection.

30. The memory system of claim 20 wherein the increasing means includes means for programming the cells predominately by way of cold electron injection.

* * * * *